United States Patent [19]
Marshall et al.

[11] Patent Number: 5,067,004
[45] Date of Patent: Nov. 19, 1991

[54] MODULE FOR INTERCONNECTING INTEGRATED CIRCUITS

[75] Inventors: Donald E. Marshall, Harvard, Mass.; James B. McElroy, Cupertino, Calif.

[73] Assignee: Digital Equipment Corporation, Maynard, Mass.

[21] Appl. No.: 450,219

[22] Filed: Dec. 13, 1989

[51] Int. Cl.$^5$ .................................................. H01L 23/48
[52] U.S. Cl. ............................................ 357/71; 357/70; 357/81
[58] Field of Search ........................... 357/71, 81, 80

[56] References Cited

U.S. PATENT DOCUMENTS

| | | | |
|---|---|---|---|
| 3,629,787 | 12/1971 | Wilson | 339/17 |
| 4,320,438 | 3/1982 | Ibrahim et al. | 361/401 |
| 4,490,690 | 12/1984 | Suzuki | 333/1 |
| 4,551,746 | 11/1985 | Gilbert et al. | 357/74 |
| 4,560,962 | 12/1985 | Barrow | 333/1 |
| 4,688,152 | 8/1987 | Chia | 361/408 |
| 4,692,839 | 9/1987 | Lee et al. | 357/81 |
| 4,739,448 | 4/1988 | Rowe et al. | 361/386 |
| 4,744,007 | 5/1988 | Watari et al. | 361/386 |
| 4,744,008 | 5/1988 | Black et al. | 361/386 |
| 4,754,371 | 6/1988 | Nitta et al. | 361/411 |
| 4,755,866 | 7/1988 | Marshall et al. | 357/81 |
| 4,770,897 | 9/1988 | Wu | 437/228 |
| 4,781,775 | 11/1988 | Reed et al. | 357/80 |
| 4,812,191 | 3/1989 | Ho et al. | 156/239 |
| 4,843,191 | 6/1989 | Thomas | 174/88 |
| 4,914,551 | 4/1990 | Anschel et al. | 357/81 |

OTHER PUBLICATIONS

R. J. Jensen et al., "Copper Polyimide Materials System for High Performance Packaging", 1984, pp. 73–81.
"Technology and Design for High Speed Digital Components in Advanced Applications", IEEE, 1983.
Semiconductor International, Jan. 1985, p. 20.

*Primary Examiner*—Eugene R. Laroche
*Assistant Examiner*—R. Ratliff
*Attorney, Agent, or Firm*—Arnold, White & Durkee

[57] ABSTRACT

An arrangement for interconnecting high density signals of integrated circuits provides minimal cross-talk, low noise and controlled impedance. A thermally conductive baseplate is used to support integrated circuit die in a multi-layered substrate. The integrated circuit die are thermally coupled to the baseplate, and the multi-layered substrate includes apertures therethrough for receiving the integrated circuit die. Tape automated bonding is used to connect leads on the integrated circuit die with conductors disposed on layers in the substrate. Other aspects of the arrangement include providing a power flex-connector and a signal flex-connector to connect the multi-layered substrate to an external power source and to a printed circuit board, respectively. To further minimize noise interference, the multi-layered substrate includes separate power and ground layers which are adjacent to one another.

16 Claims, 2 Drawing Sheets

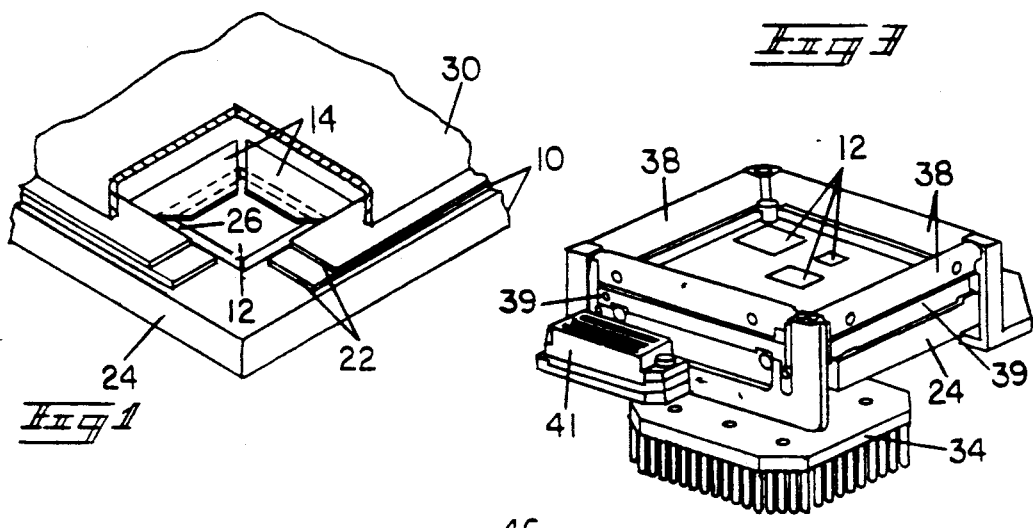
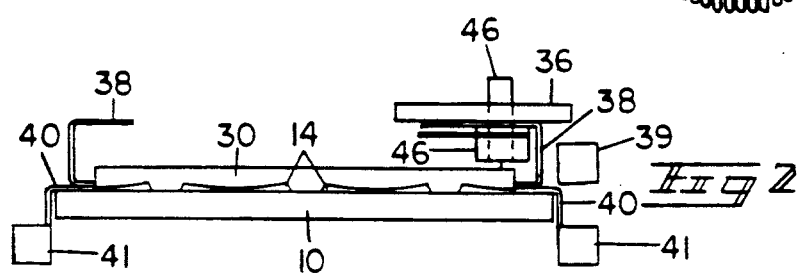
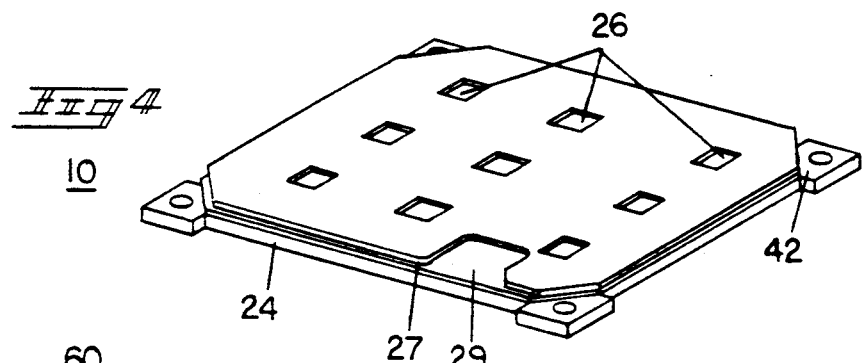
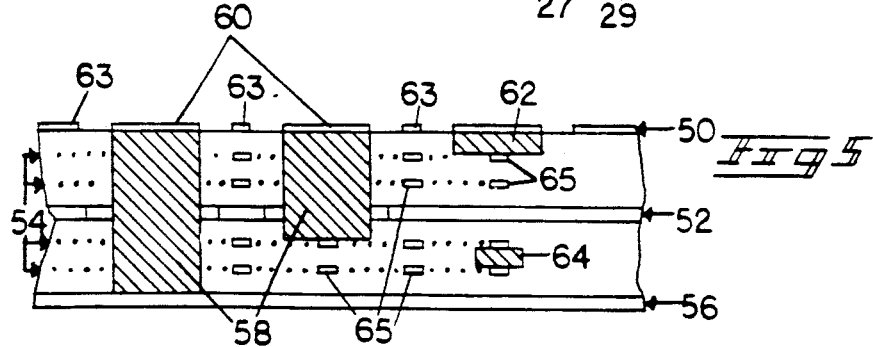

5,067,004

MODULE FOR INTERCONNECTING INTEGRATED CIRCUITS

FIELD OF THE INVENTION

The present invention relates generally to electrical signal distribution and, more particularly, to arrangements for interconnecting integrated circuits.

BACKGROUND OF THE INVENTION

Integrated circuits are continually being built and interconnected in denser and more complex packages. These circuits are being used to address high technology electronic applications and often include circuits that are designed to operate at high frequencies and at relatively high power levels. For example, many high performance digital computers are being implemented using VLSI (very large scale integration) ECL (emitter coupled logic) circuits operating at frequencies approaching 400 mega-Hertz and power density levels approaching 30 Watts per square centimeter.

When used in a relatively dense package, this type of circuitry must meet rigidly defined electrical and mechanical specifications. These specifications concern line impedance continuity, adequate heat dissipation and minimal noise and cross-talk interference. Unfortunately, these design criteria have been met with only limited success in the prior art. For example, prior art structures which have been designed to interconnect components of high performance digital computers have included multiple layers consisting of conductors disposed in a polymer matrix. Those prior art structures have dielectric properties that allow high speed pulse propagation, but they are overly sensitive to thermal and/or mechanical stresses.

Other types of prior art structures have been designed to mitigate the sensitivities referred to above. For example, certain structures use cooling plungers attached to the top of the integrated circuit chips, while others use cooling plungers attached to the bottom of the chips. Each of these prior art structures, however, has been unable to provide high density circuits that adequately operate at high frequencies and with proper thermal relief.

SUMMARY OF THE INVENTION

In accordance with a preferred embodiment, the present invention provides a high speed signal carrying arrangement for an electronic circuit which may be used to interconnect multiple integrated circuits with minimal crosstalk, low noise and controlled impedance. The arrangement includes a thermally conductive base for supporting an electronic circuit die and a multilayered substrate. The multilayered substrate includes electrical conductors disposed on its layers and an aperture through the layers for situating the die therein. The die is thermally coupled to the base within the aperture, and an electrical connector is situated to couple signals between the die and the electrical conductors in the layers of the substrate.

Preferably, tape automated bonding is used to couple the die to the electrical conductors in the substrate layers, and flex connectors are used to carry power and ground to separate power and ground layers within the substrate. Additionally, a cooling plate ma be attached to the bottom of the base to draw heat away from the base and the circuit die.

BRIEF DESCRIPTION OF THE DRAWINGS

Other objects and advantages of the present invention will become apparent upon reading the following detailed description and upon reference to the drawings in which:

FIG. 1 is a perspective, cut-away view of a module, including a high density signal carrier, for supporting and interconnecting a plurality of integrated circuits, according to the present invention;

FIG. 2 is a cross-sectional illustration of the module illustrated in FIG. 1;

FIG. 3 is another perspective view of the module illustrated in FIG. 1;

FIG. 4 is a perspective view of the high density signal carrier of FIG. 1, according to the present invention, which may be implemented as part of the module illustrated in FIG. 1;

FIG. 5 is a cross-sectional diagram of an embodiment of the high density signal carrier of FIGS. 1 through 4;

Figure 6:
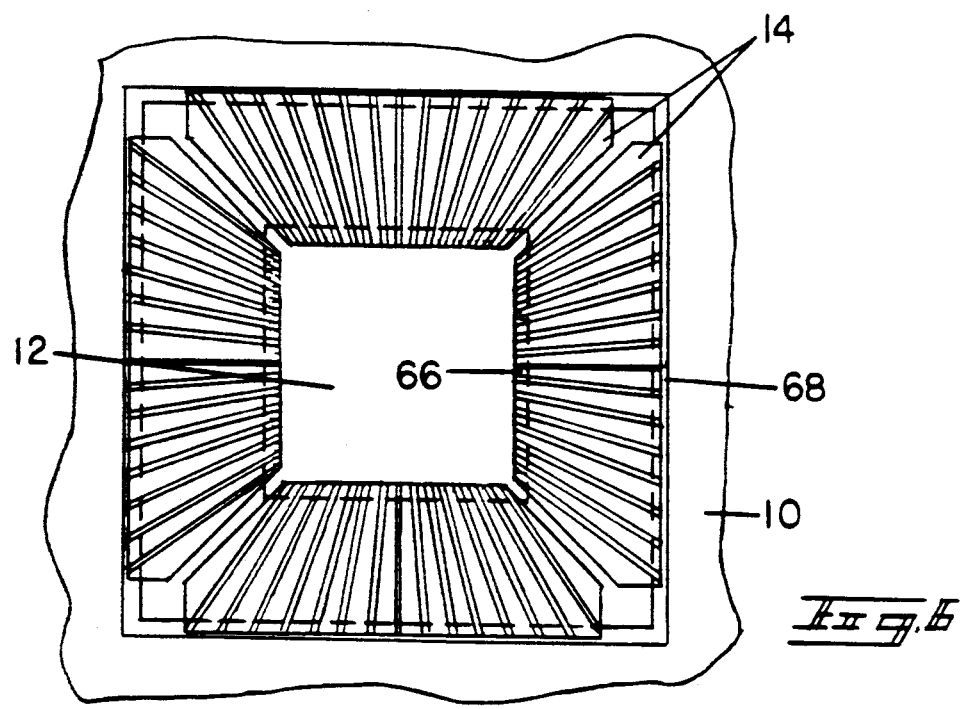
FIG. 6 is a diagram of a semiconductor die, shown from a top view, illustrating a preferred technique for connecting leads on the die to electrical conductors disposed on layers of the high density signal carrier of FIG. 4.

While the invention is susceptible to various modifications and alternative forms, specific embodiments thereof have been shown by way of example in the drawings and will herein be described in detail. It should be understood, however, that it is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE PREFERRED EMBODIMENTS

The present invention is directed to the electrical interconnection of high density integrated circuits on a common base. There are a variety of circuit types that may be used with the present invention; however, the present invention has particular use for interconnecting high density, high speed VLSI ECL logic arrays, requiring thermal relief.

Turning now to the drawings, FIG. 1 provides a perspective, cut-away view of an arrangement or multichip unit (MCU), according to the present invention, for optimally interconnecting high speed, high power, integrated circuits having high pin counts. The MCU of FIG. 1 includes a high density signal carrier (HDSC) 10 which is used to intercouple electrical signals between leads of certain integrated circuit die 12 and between leads of the integrated circuit die 12 and external circuitry (not shown in FIG. 1). The leads of the integrated circuit die 12 are electrically coupled to the HDSC 10 using conventional tape automated bonding techniques. Hereinafter, the product of the tape automated bonding process 10 will be referred to as a "TAB," depicted as 14 in FIG. 1.

The HDSC 10 includes a thermally conductive baseplate 24 and thin layers 22 of copper and dielectric material. Certain ones of the layers 22 are electrically conductive planes for carrying power and ground, while other ones include conductive traces for carrying information signals. All conductive planes and traces are preferably copper and are used for interfacing to the integrated circuit die 12. The dielectric material, preferably polyimide, is used to separate conductive signal traces and power planes.

Through the dielectric material of the layers 22, a plurality of apertures (or die sites) 26 is provided for receiving respective die 12 therein. The die sites 26 are preferably made after the layers 22 of the multilayered substrate have been formed but prior to adhering the layers to the baseplate 24.

A preferred method of cutting the die sites 26 is described in co-pending U.S. application Ser. No. 07/371,211, entitled "Apparatus and Method for Forming Die Sites in a High Density Electrical Interconnecting Structure," filed on June 6, 1989 by Shamouil Shamouilan and Paul N. Ludwig; that application is assigned to the present assignee and incorporated herein by reference.

The baseplate 24 serves two purposes: to spread the heat for the power dissipated by the die and to provide a structural base for the MCU. The dimensions of the baseplate 24 are dependent upon the heat required to be dissipated and the size, weight and distribution of the MCU. The baseplate 24 is preferably made of molybdenum, but other thermally conductive materials, such as nickel-plated, solid copper, may also be used. Thus, the baseplate 24 provides a thermal expansion coefficient compatible with the die 12 and a rigid platform to enhance planarity and minimize warping.

The die 12 are preferably secured to the baseplate 24 using conventional tin-lead techniques (with negligible air voids). Alternatively, a diamond-particle filled epoxy, preferably having a 75%-85% weight range, may be used which increases the thermal conductivity and electrical resistivity. That epoxy composite is further described in co-pending U.S. patent application Ser. No. 07/302,414 entitled "Thermally Conductive Electrically Resistive Diamond Filler Epoxy Adhesive," by Chune Lee et al., filed on Jan. 27, 1989, also assigned to the instant assignee and incorporated herein by reference.

The integrated circuit die 12 and the top layer of the HDSC 10 may be covered by a lid 30, preferably constructed of aluminum or durable plastic. The lid 30 may be bolted to a housing (not shown) to provide protection to the die 12, the TABs 14 and related structure from mechanical damage.

FIGS. 2 and 3 illustrate cross-sectional and perspective views of the arrangement of FIG. 1. These views illustrate, as part of the arrangement in FIG. 1, a cold plate 34 and a preferred manner in which the HDSC 10 is interconnected to external circuitry. The cold plate 34 is used to provide cooling for the die 12. The cold plate 34 is preferably implemented by bolting an air-impingent solid aluminum array to the baseplate 24 to assist the baseplate 24 with the dissipation of heat from the die 12. Alternatively, the cold plate 34 may be implemented using a water coo led plate-fin heat exchanger which may be connected to the water circuit of the cooling system through a removable flexible hose.

External circuitry which is interconnected to the HDSC 10 includes external power and information signals, either or both of which may be supplied from a printed circuit (or wire) board 36. However, the power return path is preferably independent of the information signal path. This may be accomplished, as illustrated in FIG. 2, by using an external power source connected at connectors 41 to provide power to a power bus in the HDSC 10.

Power flex circuits 40 are used to interconnect the power bus in the HDSC 10 with the connectors 41. The power flex circuits 40, one of which is hidden behind the connector 41 in FIG. 3, are soldered at one end to the HDSC power planes and are mated at the connector 41 using surface mount bumps (or elevated conductor pads). The connector 41 is used to connect the HDSC 10 with an external power distribution bus. In a particular embodiment, the power flex circuits 40 carry three voltages ground, 5.2v and 3.2v.

The printed circuit board (PCB) 36 may be interconnected between multiple MCUs and to other system components. The PCB 36 is preferably connected to the HDSC 10 using a signal flex circuit 38 to provide the entire signal interface from the MCU. There is one signal flex circuit 38 on each of the four edges of the MCU, and one spring retainer clip 39 at each edge to help secure the flex circuit 38 to the MCU.

The signal flex circuits 38 are secured at the PCB 36 using respective force distribution beams 46 and are soldered to the HDSC 10 top surface (layer 50 of FIG. 5) on 0.008×0.008 inch pads. The PCB may be bolted to the HDSC 10 as shown by dotted lines in FIG. 3.

In one embodiment, each signal flex circuit 38 separately carries 200 input/output signals and 100 reference plane connections, and the signal lines through the flex circuit 38 are about 1.25 inches long with a characteristic impedance of 58 Ohms. The length of the signal flex circuit 38 may be reduced by routing it from the HDSC 10 below the lower portion of the beam 46, up along the inside of the beam 46, along the PCB 36 and finally down to the clip 39; this structure is depicted in FIG. 3.

Figure 7:
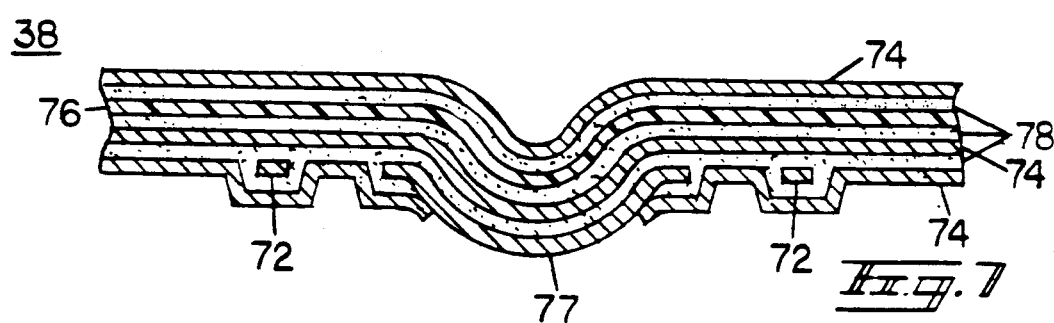
FIG. 7 is a cross-sectional diagram of a flex connector which may be used to carry signals and/or power to the high density signal carrier of FIGS. 1 through 4.
Figure 8:
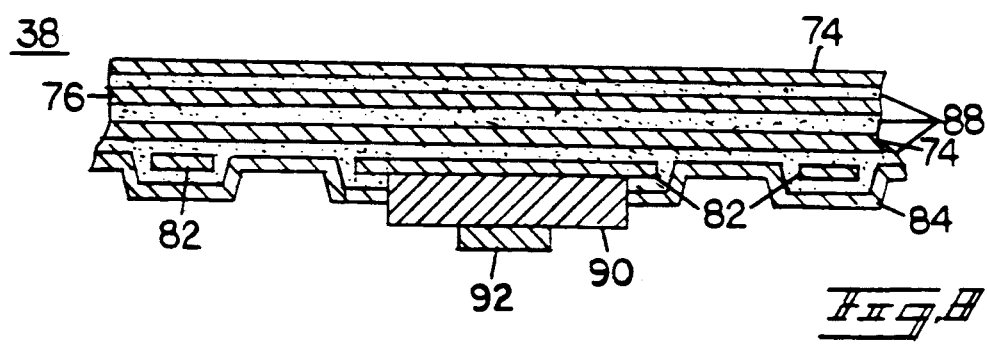
FIG. 8 is a cross-sectional diagram of an alternative flex connector which may be used to carry signals and/or power to the high density signal carrier of FIGS. 1 through 4.

FIGS. 7 and 8 illustrate cross-sectional views of two stripline structures which may be used to implement the signal flex circuit 38. The structures include copper lines 72 and 82 that are insulated from one another to provide controlled impedance, low noise signal paths. This is accomplished using evenly distributed dielectric material, such as polyimate or Kapton, to form layers 74 and 84 surrounding the copper lines 72 and 82 and adjacent copper reference planes 76 and 86. The layers 74 and 84 and the references planes 76 and 86 are held together with adhesive layers 78 and 88. Gold plated bumps 77 of FIG. 7 and copper pedestals 90 and gold plated bumps 92 of FIG. 8 are used to interconnect with the PCB 36.

FIG. 4 provides a perspective view of the HDSC 10. The thermally conductive baseplate 24 includes a top surface 42 against which the substrate layers 22 are secured using conventional epoxy. Each die is attached to the baseplate 24 through one of the die-shaped apertures 26 to provide the optimum thermal path to the baseplate 24 and the cold plate 34 (FIG. 3). To minimize obstruction of the conductor routing paths in the layers 22, the apertures 26 are large enough to allow for about a 0.05 inch gap around the die. The gap allows the diamond epoxy under the die 12 to bleed and provides space for die insertion tooling. The gap area is preferably provided on all four sides of larger die and is used on two of the four sides of smaller die. From the edge of each aperture 26, conductors should be spaced at a distance of at least 300 microns.

The HDSC 10 preferably consists of three distinct sections which are integrated and, therefore, inseparable after fabrication. They are the signal core 27, the power core 29 and the baseplate 24. The signal core 27 is shown in FIG. 5 to include dual stripline conductor sections comprising conductive traces 63 (in top signal layer 50), conductive traces 65 (in middle signal layers 54) and reference planes in layers 50, 52 and 56. It is intended that the reference plane in layer 50 completely covers the top surface of the signal layer 50, except where the conductive traces 63 and bonding pads (not shown) for the TABs 14 are disposed. The top surface of the layer 50 is preferably solder-plated for attaching surface components thereon. The power core 29, which is not shown in FIG. 5, similarly includes two power planes and two power return (or ground) planes.

Drilled and plated through-holes (or vias) 58, 62 and 64 distribute signals and power between top surface pads 60, the signal core 27 and the power core 29.

In a preferred embodiment: the vias are no more than 100 microns in diameter; the minimum space between any two vias or a conductive trace and a via is 42 microns; generally, each of the layers (including layers 50–56) is 9 to 18 microns thick; each of the power planes is an 18 to 36 micron thick copper plane which is used to carry the electrical power from the perimeter of the HDSC to the die sites; to provide distributed capacitance and eliminate the need for discrete noise-suppression capacitors, the minimum space between any power plane and another conducting element is 100 microns; and the dielectric separating the power planes is a maximum of 13 microns thick for optimal noise suppression, consisting of two 2.5 micron adhesive layers and an 8 micron layer of polyimide. Also, to eliminate the need for discrete termination resistors, the signals at the die are source terminated using termination circuits within each die.

For additional information relating to the HDSC 10, reference may be made to "Method of Forming a Multilevel Interconnection Device," U.S. Pat. No. 4,812,191, Ho et al., assigned to the instant assignee and incorporated herein by reference.

FIG. 6 illustrates the TABs 14 which are used to intercouple the die 12, having high lead counts, with leads on the top layer of the HDSC 10. Each TAB 14 may be implemented using a conventional polyimide/copper structure. Inner leads (ILB) 66 are bonded to the die at conductive bumps located on the die 12. Outer leads (OLB) 68 are bonded to the HDSC 10 with solder which is screened onto the HDSC TAB bonding pads (not shown). In a preferred TAB embodiment: the ILB pads 66 are 100 microns wide with 100 micron spaces; the signal leads are microstrip, controlled impedance lines; and the power leads are two channels wide and are separated at each end into two bonding areas.

The use of microstrip (or other stripline-like structure) is preferably used for all signals carried between the PCB 36 and the surface of the die 12. This is especially advantageous for controlling the impedance for high speed signals. Thus, the TAB, the flex circuit and the HDSC have been described as including a reference plane to provide this advantage.

Using the parameters described herein, the following results have been realized: a lead transit time of about 40 pico-seconds and a lead capacitance of about 0.4 pico-Farads with typical TAB lead lengths on the order of 0.7 cm; a thermal temperature rise of less than 0.5° C./Watt/cm:; signal delay on the order of 60 pico-seconds/cm; with a circuit input capacitance of about 2 pico-Farads, a delay per unit load for the HDSC-TAB on the order of 140 pico-seconds; and, due to the MCU's substantial reduction of input/output lead inductance, the virtual elimination of simultaneous switching noise as a delay. Additionally, the intimately adjacent power and ground planes in the MCU reduce power supply noise at the TAB input to negligible values.

Accordingly, the present invention provides an integrated circuit connection arrangement that accommodates high density, high speed and high power integrated circuit die, and that provides signal and power distribution having low noise, controlled impedance and high velocity interconnect.

While the invention has been particularly shown and described with reference to various embodiments, it will be recognized by those skilled in the art that other modifications and changes may be made to the present invention described above without departing from the spirit and scope thereof.

What is claimed is:

1. A signal carrying arrangement for an electronic circuit, comprising:
   a thermally conductive base, having a top surface and a body constructed to provide a rigid platform to enhance planarity and minimize warping of the signal carrying arrangement;
   a plurality of electronic circuit die, each having a bottom surface mounted over the top surface of and thermally coupled to the base, having leads for carrying signals;
   a multilayered substrate having a bottom surface disposed adjacent the top surface of the base, electrical conductors in layers of the substrate for interconnecting the die and a plurality of apertures for receiving the respective die therein; and
   an electrical connector arrangement to coupled signals between the leads of the electronic circuit die and the electrical conductors in the substrate.

2. A signal carrying arrangement, according to claim 1, wherein the die are coupled to the base using diamond-filled epoxy.

3. A signal carrying arrangement, according to claim 1, wherein the multilayered substrate is comprised primarily of copper conductors and polyimide.

4. A signal carrying arrangement, according to claim 3, wherein the copper conductors and polyimide alternate so that the polyimide provides insulation to the copper conductors.

5. A signal carrying arrangement, according to claim 1, wherein the multilayered substrate includes copper conductors and polyimide situated to provide at least one stripline conductor section.

6. A signal carrying arrangement, according to claim 1, wherein the layers are integrated to form the multilayered substrate.

7. A signal carrying arrangement, according to claim 1, wherein the layers of the multilayered substrate and the base are inseparably secured to one another.

8. A signal carrying arrangement, according to claim 1, wherein the electrical connector arrangement is a product of tape automated bonding.

9. A signal carrying arrangement, according to claim 1, wherein each aperture is defined by four sides which run through each layer of the substrate.

10. A high density signal carrying arrangement for an electronic circuit, comprising:
- a thermally conductive base having a top surface and a rigid and supportive body constructed to provide a rigid platform to enhance planarity and minimize warping of the signal carrying arrangement;
- a printed circuit board;
- a plurality of high density electronic circuit die, each of the die having a bottom surface mounted over the top surface of and thermally coupled to the base and each having leads for carrying signals;
- a multilayered substrate having a bottom surface disposed adjacent the top surface of the base, electrical conductors in layers of the substrate and a plurality of apertures in the base, each aperture receiving one of the die therein;
- for each die, a plurality of TABs arranged to intercoupled signals, including power signals, between the leads of the die and the electrical conductors in the substrate; and
- connection means arranged to intercoupled power signals between the substrate and a power source, and to intercoupled the substrate conductors and the printed circuit board.

11. A high density signal carrying arrangement, according to claim 10, wherein the multi-layered substrate includes separate and adjacent layers for power and ground.

12. A high density signal carrying arrangement, according to claim 10, wherein each of the die is secured to the base using a thermally conductive epoxy to provide thermal relief for the die through the base.

13. A high density signal carrying arrangement for an electronic circuit, comprising:
- a thermally conductive base having a top surface and a bottom surface and a rigid supporting body constructed to provide a rigid platform to enhance planarity and minimize warping of the signal carrying arrangement;
- a cooling plate thermally secured to the bottom surface of the base;
- a plurality of high density electronic circuit die, each of the die having a bottom surface mounted over and thermally coupled to the base and each having leads for carrying signals;
- a multilayered substrate having a bottom surface disposed adjacent the top surface of the base, electrical conductors in layers of the substrate and a plurality of apertures in the base, each aperture extending through each layer of the substrate for receiving one of the die therein;
- for each die, at least one TAB for intercoupling signals between the leads of the die and the electrical conductors in the substrate;
- a flex connector; and
- a printed circuit board, intercoupled to the multilayered substrate using the flex connector, for intercoupling signals between external circuitry and one or more of the die.

14. A high density signal carrying arrangement, according to claim 13, wherein each of the die is secured to the base using a diamond-particle filled epoxy to provide thermal relief for the die through the base.

15. A high density signal carrying arrangement, according to claim 13, wherein at least one reference plane is included between the die and the printed circuit board to provide controlled impedance for the signals carried therebetween.

16. A high density signal carrying arrangement, according to claim 13, wherein the cooling plate is air cooled.

* * * * *